(12) United States Patent
Poynton (10) Patent No.: US 7,256,676 B2
(45) Date of Patent: Aug. 14, 2007

(54) PRINTED CIRCUIT BOARD AND DEVICE INCLUDING SAME

(75) Inventor: Ian Poynton, Marana, AZ (US)

(73) Assignee: Artesyn Technologies, Inc., Boca Raton, FL (US)

( * ) Notice: Subject to any disclaimer, the term of this patent is extended or adjusted under 35 U.S.C. 154(b) by 10 days.

(21) Appl. No.: 11/228,831

(22) Filed: Sep. 16, 2005

(65) Prior Publication Data
US 2007/0063805 A1    Mar. 22, 2007

(51) Int. Cl.
*H01F 5/00*    (2006.01)
*H01F 7/06*    (2006.01)

(52) U.S. Cl. .............. 336/200; 336/223; 336/232; 29/602.1

(58) Field of Classification Search ........... 336/200, 336/223, 232; 29/602.1
See application file for complete search history.

(56) References Cited

U.S. PATENT DOCUMENTS

| | | | |
|---|---|---|---|
| 5,559,487 A | 9/1996 | Butcher et al. | |
| 5,631,822 A | 5/1997 | Silberkleit et al. | |
| 5,777,539 A * | 7/1998 | Folker et al. | 336/200 |
| 5,990,776 A * | 11/1999 | Jitaru | 336/200 |
| 6,380,834 B1 | 4/2002 | Canzano et al. | |
| 6,429,763 B1 | 8/2002 | Patel et al. | |
| 6,593,841 B1 | 7/2003 | Mizoguchi et al. | |
| 6,664,883 B2 | 12/2003 | Patel et al. | |
| 2003/0179067 A1* | 9/2003 | Gamou et al. | 336/223 |

\* cited by examiner

*Primary Examiner*—Anh Mai
(74) *Attorney, Agent, or Firm*—Kirkpatrick & Lockhart Preston Gates Ellis LLP

(57) ABSTRACT

A multi-layer printed circuit board. The multi-layer printed circuit board includes a first winding, and a first via connected to the first winding. The first winding includes a first edge. The first edge defines a first footprint. The first footprint surrounds and is proximate an opening defined by the printed circuit board. At least a portion of the first via is between the first footprint and the opening.

29 Claims, 11 Drawing Sheets

PRINTED CIRCUIT BOARD AND DEVICE INCLUDING SAME

BACKGROUND OF INVENTION

This application is related, generally and in various embodiments, to a multi-layer printed circuit board. For applications requiring increased device densities, it is well known in the art to use multi-layer printed circuit boards to minimize the footprint required by the printed circuit board. As the area allotted for the footprint decreases, the spacing between components decreases and the difficulty of meeting various isolation requirements becomes more difficult. For many circuit board layouts designed to meet the space and isolation requirements, the layouts often experience undesired hot spots and termination losses that lead to premature board failure.

Examples of such layouts are shown in FIGS. 1A-D and 2A-E. FIGS. 1A-D illustrate an exploded view of layers of a multi-layer printed circuit board 10. The printed circuit board 10 includes a first layer 12, a second layer 14, a third layer 16, and a fourth layer 18. The printed circuit board 10 also includes a first via 20, a second via 22, and a third via 24. The printed circuit board 10 further includes a first winding 26 and defines an opening 28. The opening 28 is configured to receive a magnetic core therein.

Figure 1A:
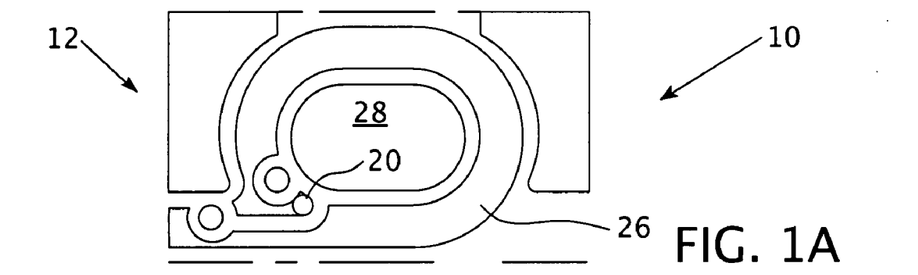
FIGS. 1A-D illustrate a multi-layer printed circuit board.

Referring to FIG. 1A, a first turn of the first winding 26 starts at the lower left portion of the first layer 12, winds around the opening 28 in a counter-clockwise direction, and connects to the first via 20, which extends from the first layer 12 to the second layer 14. As shown in FIG. 1A, the first winding 26 is arranged to maintain a certain minimum distance from the opening 28. The first winding 26 is also arranged to maintain a certain minimum distance from the second via 22 and to maintain a certain minimum distance from the third via 24. Due to limitations of the packaging area available on the first layer 12, the cross-sectional area of the first winding 26 is noticeably reduced proximate the second via 22 to maintain the desired minimum distance between the first winding 26 and the second via 22 and noticeably reduced proximate the third via 24 to maintain the desired minimum distance between the first winding 26 and the third via 24.

Figure 1B:
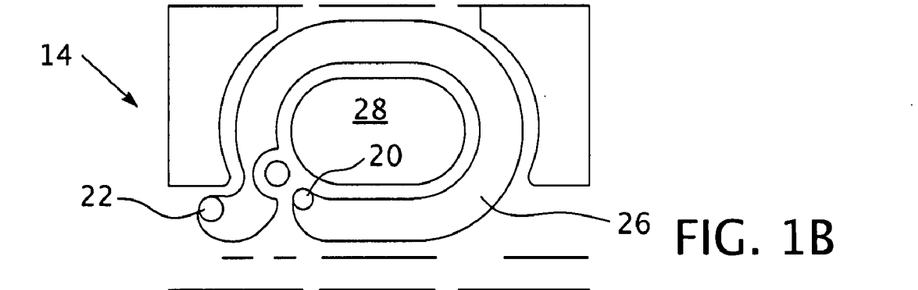

Referring to FIG. 1B, a second turn of the first winding 26 arranged on the second layer 14 starts at the first via 20, winds around the opening 28 in a counter-clockwise direction, and connects to the second via 22, which extends from the second layer 14 to the third layer 16. As shown in FIG. 1B, the first winding 26 is arranged to maintain a certain minimum distance from the opening 28. The first winding 26 is also arranged to maintain a certain minimum distance from the third via 24. Due to limitations of the packaging area available on the second layer 14, the cross-sectional area of the first winding 26 is noticeably reduced proximate the third via 24 to maintain the desired minimum distance between the first winding 26 and the third via 24.

Figure 1C:
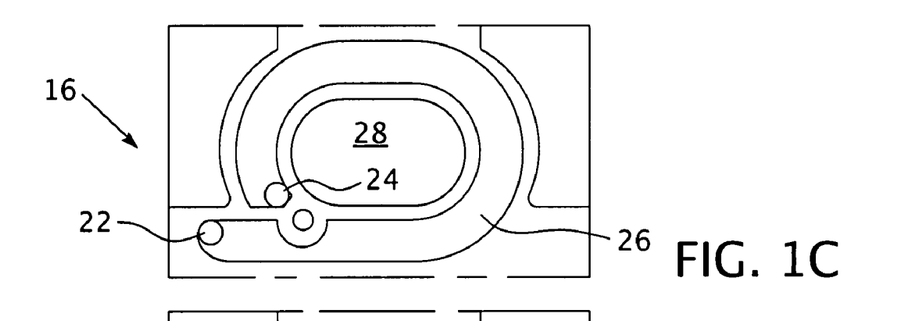

Referring to FIG. 1C, a third turn of the first winding 26 arranged on the third layer 16 starts at the second via 22, winds around the opening 28 in counter-clockwise direction, and connects to the third via 24, which extends from the third layer 16 to the fourth layer 18. As shown in FIG. 1C, the first winding 26 is arranged to maintain a certain minimum distance from the opening 28. The first winding 26 is also arranged to maintain a certain minimum distance from the first via 20. Due to limitations of the packaging area available on the third layer 16, the cross-sectional area of the first winding 26 is noticeably reduced proximate the first via 20 to maintain the desired minimum distance between the first winding 26 and the first via 20.

Figure 1D:
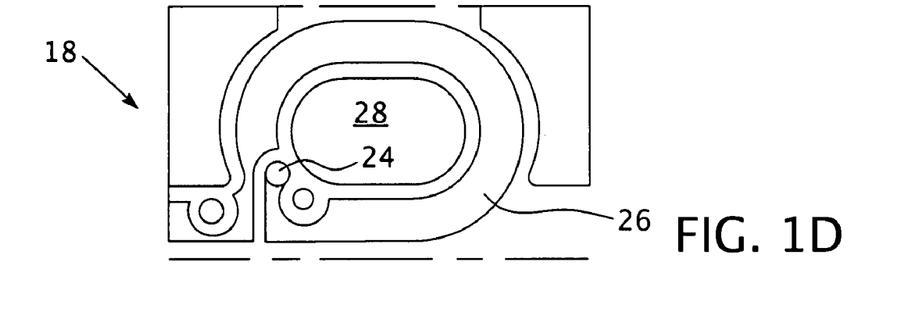

Referring to FIG. 1D, a fourth turn of the first winding 26 arranged on the fourth layer 18 starts at the third via 24, winds around the opening 28 in a counter-clockwise direction, and ends at the lower left edge of the fourth layer 18. As shown in FIG. 1D, the first winding 26 is arranged to maintain a certain minimum distance from the opening 28. The first winding 26 is also arranged to maintain a certain minimum distance from the first via 20 and to maintain a certain minimum distance from the second via 22. Due to limitations of the packaging area available on the fourth layer 18, the cross-sectional area of the first winding 26 is noticeably reduced proximate the first via 20 to maintain the desired minimum distance between the first winding 26 and the first via 20 and noticeably reduced proximate the second via 22 to maintain the desired minimum distance between the first winding 26 and the second via 22.

The reduction or necking down of the cross-sectional area of the first winding 26 proximate the first via 20, the second via 22, or the third via 24 can easily result in undesirable hot spots and termination losses that lead to premature failure.

Figure 2A:
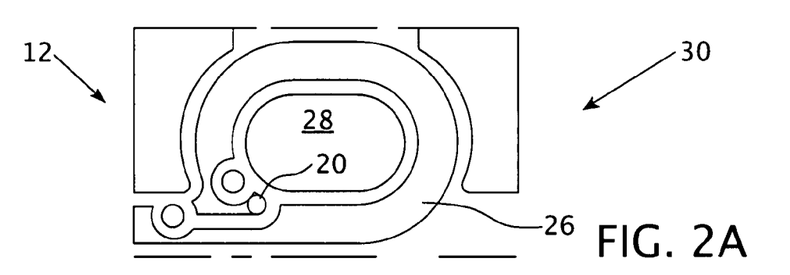
FIGS. 2A-2E illustrate a multi-layer printed circuit board.
Figure 2B:
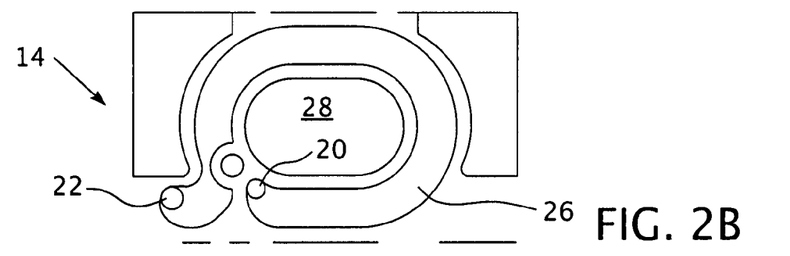
Figure 2C:
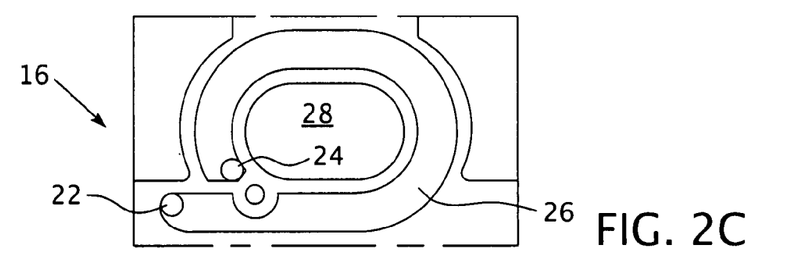
Figure 2D:
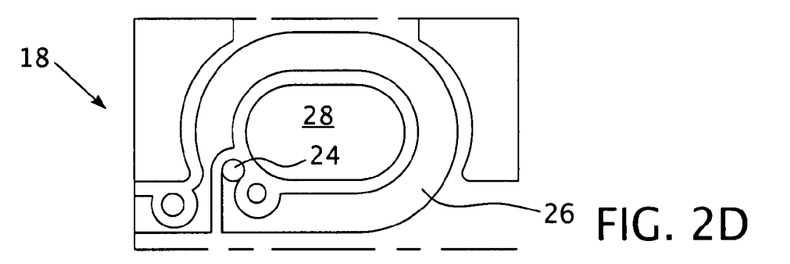
Figure 2E:
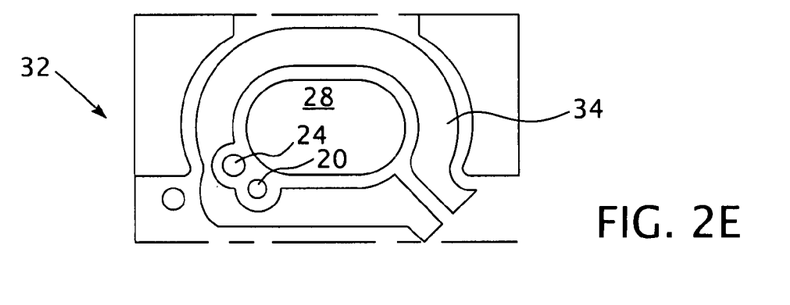

FIGS. 2A-2E illustrate an exploded view of layers a multi-layer printed circuit board 30. The printed circuit board 30 is similar to the printed circuit board 10, but also includes a fifth layer 32 and a second winding 34 arranged on the fifth layer 32. Referring to FIG. 2E, the terminations of the second winding 32 are located at the lower right portion of the fifth layer 32. Similar to the first winding 26, the second winding 34 is arranged to maintain a certain minimum distance from the opening 28. The second winding 34 is also arranged to maintain a certain minimum distance from the first via 20 and to maintain a certain minimum distance from the third via 24. Due to limitations of the packaging area available on the fifth layer 32, the cross-sectional area of the second winding 34 is noticeably reduced proximate the first via 20 to maintain the desired minimum distance between the second winding 34 and the first via 20 and noticeably reduced proximate the third via 24 to maintain the desired minimum distance between the second winding 34 and the third via 24. The reduction or necking down of the cross-sectional area of the second winding 34 proximate the first via 20 or the third via 24 can also easily result in undesirable hot spots and termination losses that lead to premature failure.

SUMMARY

In one general respect, this application discloses a multi-layer printed circuit board. According to various embodiments, the multi-layer printed circuit board includes a first winding, and a first via connected to the first winding. The first winding includes a first edge. The first edge defines a first footprint. The first footprint surrounds and is proximate an opening defined by the printed circuit board. At least a portion of the first via is between the first footprint and the opening.

In another general respect, this application discloses a device that includes a multi-layer printed circuit board and a magnetic core. According to various embodiments, the multi-layer printed circuit board includes a first winding, and a first via connected to the first winding. The first winding includes a first edge. The first edge defines a first footprint. The first footprint surrounds and is proximate an opening defined by the printed circuit board. At least a portion of the first via is between the first footprint and the opening. The magnetic core is in the opening In another general respect, this application discloses a method of forming a device. According to various embodiments, the method includes forming a first winding on a first layer of the printed circuit board, and forming a first via connected to the first winding. Forming the first winding includes forming the first winding to include a first edge that defines a first footprint that surrounds and is proximate an opening defined by the printed circuit board. Forming the first via includes forming the first via such that at least a portion of the first via is between the first footprint and the opening.

DETAILED DESCRIPTION OF THE INVENTION

It is to be understood that the figures and descriptions of the disclosed invention have been simplified to illustrate elements that are relevant for a clear understanding of the present invention, while eliminating, for purposes of clarity, other elements of a conventional multi-layer printed circuit board. For example, various insulating layers are not shown. Those of ordinary skill in the art will recognize, however, that these and other elements may be desirable. However, because such elements are well known in the art, and because they do not facilitate a better understanding of the present invention, a discussion of such elements is not provided herein.

FIGS. 3A-3D illustrate an exploded view of layers of a multi-layer printed circuit board 40. The printed circuit board 40 may include a first layer 42, a second layer 44, a third layer 46 and a fourth layer 48. The printed circuit board 40 may also include a first via 50, a second via 52, and a third via 54. As may be seen from comparing FIGS. 3A-3D to FIGS. 1A-1D, the respective layers of the printed circuit board 40 may be of a size similar to that of the respective layers of printed circuit board 10. In addition, the relative locations of the first, second and third vias 50-54 of FIGS. 3A-3D may be similar to the relative locations of the first, second and third vias 20-24 of FIGS. 1A-1D. The printed circuit board 40 may further include a first winding 56 and defines an opening 58. The first winding 56 may be fabricated from a conductive material such as, for example, copper. According to various embodiments, the opening 58 may be an irregular-shaped opening such as, for example, the shape shown in FIGS. 3A-3D.

Figure 3A:
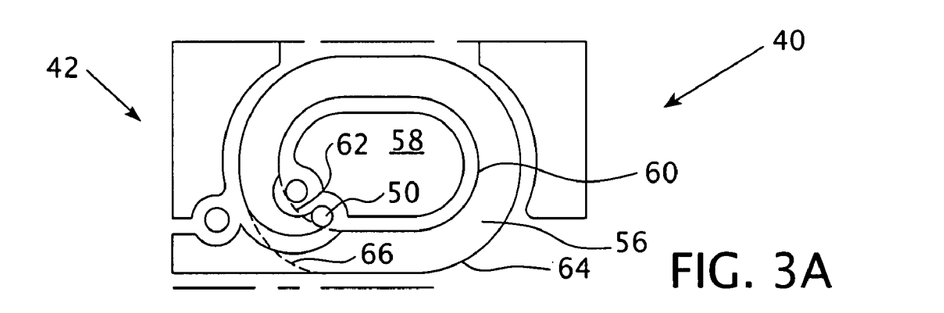
FIGS. 3A-3D illustrate various embodiments of a multi-layer printed circuit board.

Referring to FIG. 3A, a first turn of the first winding 56 starts at the lower left portion of the first layer 42, winds around the opening 58 in a counter-clockwise direction, and connects to the first via 50, which extends from the first layer 42 to the second layer 44. As shown in FIG. 3A, the first winding 56 is arranged to maintain a certain minimum distance from the opening 58. The first winding 56 includes a first edge 60 that defines a first footprint 62 that surrounds and is proximate the opening 58. According to various embodiments, the first footprint 62 may be a regular-shaped footprint. A portion of the first footprint 62 is shown by a dashed line in FIG. 3A. Although the first footprint 62 is shown in FIG. 3A as an oval-shaped footprint, one skilled in the art will appreciate that the first footprint 62 can be of any shape.

The first winding 56 may also include a second edge 64 that defines a second footprint 66 that surrounds the first footprint 62. According to various embodiments, the second footprint 66 may be a regular-shaped footprint. A portion of the second footprint 66 is shown by a dashed line in FIG. 3A. Although the second footprint 66 is shown in FIG. 3A as an oval-shaped footprint, one skilled in the art will appreciate that the second footprint 66 can be of any shape. The arrangement of the first winding 56 on the first layer 42 maintains a sufficient cross-section proximate the second via 52 and the third via 54 to minimize concerns associated with hot spots and termination losses. As shown in FIG. 3A, the first via 50 is substantially between the first footprint 62 and the opening 58. According to various embodiments, at least a portion of the first via 50 is between the first footprint 62 and the opening 58.

Figure 3B:
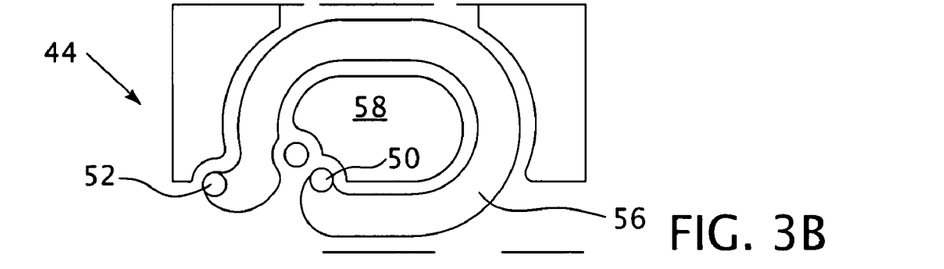

Referring to FIG. 3B, a second turn of the first winding 56 arranged on the second layer 44 starts at the first via 50, winds around the opening 58 in a counter-clockwise direction, and connects to the second via 52, which extends from the second layer 44 to the third layer 46. As shown in FIG. 3B, the first via 50 is substantially between the first footprint 62 and the opening 58 and the second footprint 66 is between the second via 52 and the first footprint 62. As shown in FIG. 3B, the second turn of the first winding 56 may be substantially aligned with the first turn of the first winding 56. The arrangement of the first winding 56 on the second layer 44 maintains a sufficient cross-section proximate the third via 54 to minimize concerns associated with hot spots and termination losses.

Figure 3C:
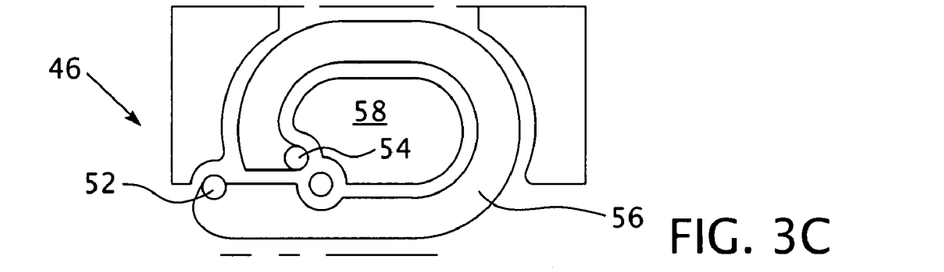

Referring to FIG. 3C, a third turn of the first winding 56 arranged on the third layer 46 starts at the second via 52, winds around the opening 58 in a counter-clockwise direction, and connects to the third via 54, which extends from the third layer 46 to the fourth layer 48. As shown in FIG. 3C, the third via 54 is substantially between the first footprint 62 and the opening 58. According to various embodiments, at least a portion of the third via 54 is between the first footprint 62 and the opening 58. As shown in FIG. 3C, the third turn of the first winding 56 may be substantially aligned with the first and second turns of the first winding 56. The arrangement of the first winding 56 on the third layer 46 maintains a sufficient cross-section proximate the first via 50 to minimize concerns associated with hot spots and termination losses.

Figure 3D:
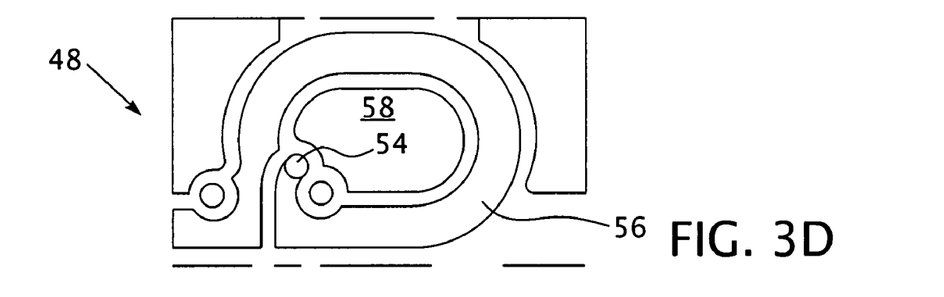

Referring to FIG. 3D, a fourth turn of the first winding 56 arranged on the fourth layer 48 starts at the third via 54, winds around the opening 58 in a counter-clockwise direction, and ends at the lower left edge of the fourth layer 48. As shown in FIG. 3D, the fourth turn of the first winding 56 may be substantially aligned with the first, second and third turns of the first winding 56. The arrangement of the first winding 56 on the fourth layer 48 maintains a sufficient cross-section proximate the first via 50 and the second via 52 to minimize concerns associated with hot spots and termination losses. According to various embodiments, the first winding 56 may be arranged on the first layer 42 of the printed circuit board 40. According to various embodiments, the first winding 56 may be arranged on more than one layer of the printed circuit board 40 (e.g., the first layer 42 and the second layer 44). According to various embodiments, the first winding 56 may be arranged on a plurality of layers of the printed circuit board 40 (e.g., the first layer 42, the second layer 44, and the third layer 46).

Figure 4A:
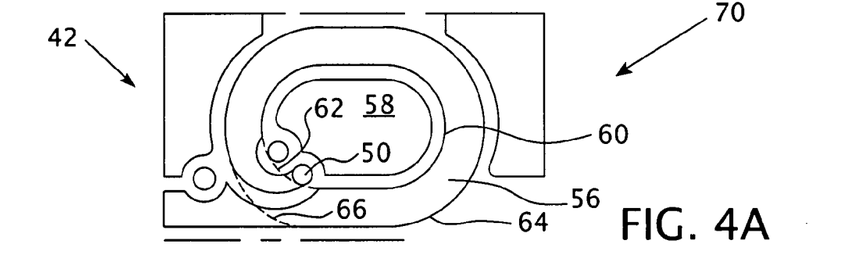
FIGS. 4A-4E illustrate various embodiments of a multi-layer printed circuit board.
Figure 4B:
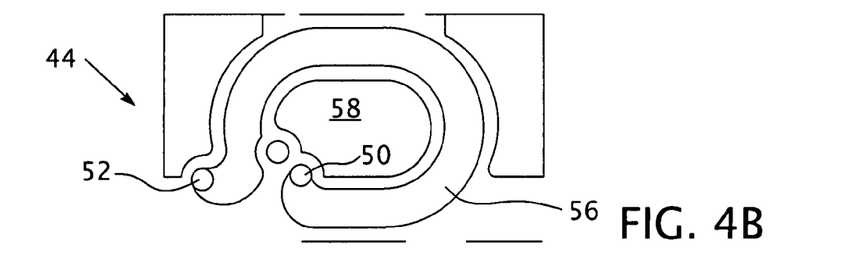
Figure 4C:
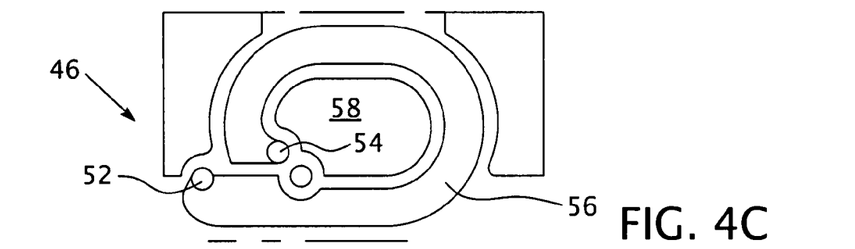
Figure 4D:
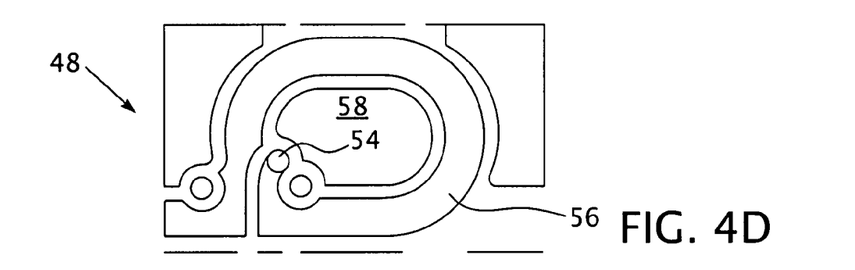
Figure 4E:
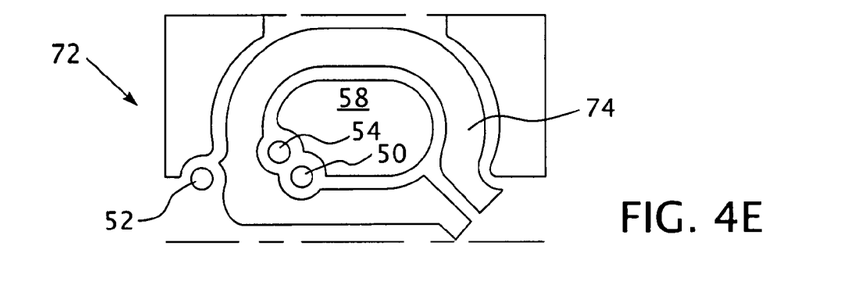

FIGS. 4A-4E illustrate an exploded view of layers a multi-layer printed circuit board 70. The printed circuit board 70 is similar to the printed circuit board 40, but also includes a fifth layer 72 and a second winding 74 arranged on the fifth layer 72. Referring to FIG. 4E, the terminations of the second winding 72 are located at the lower right portion of the fifth layer 72. As shown in FIG. 4E, the second winding 74 may be substantially aligned with portions of the first, second, third and fourth turns of the first winding 56. The arrangement of the second winding 74 on the fifth layer 72 maintains a sufficient cross-section proximate the first via 50, the second via 52 and the third via 54 to minimize concerns associated with hot spots and termination losses. According to various embodiments, the second winding 74 may be a single-turn winding, a two-turn winding, or a multi-turn winding. Accordingly, the second winding 74 may be arranged on one layer of the printed circuit board 70, on more than one layer of the printed circuit board 70, or on a plurality of layers of the printed circuit board 70.

FIGS. 5A-5E illustrate various embodiments of a multi-layer printed circuit board 80. The printed circuit board 80 may include a first layer 82, a second layer 84, a third layer 86, a fourth layer 88 and fifth layer 90. The printed circuit board 80 may include a first winding 92, a second winding 94, and a third winding 96. The printed circuit board 80 may also include a first via 98 connected to the first winding 92, a second via 100 connected to the first winding 92, a third via 102 connected to the first winding 92, and a fourth via 104 connected to the first winding 92. The printed circuit board 80 may also include a fifth via 106 connected to the second winding 94, a sixth via 108 connected to the third winding 96, and a seventh via 110 connected to the second and third windings 94, 96. The printed circuit board 80 may define a first opening 112 and a second opening 114. According to various embodiments, at least one of the first and second openings 112, 114 may be an irregular-shaped opening such as, for example, the shapes shown in FIGS. 5A-5E.

Figure 5A:
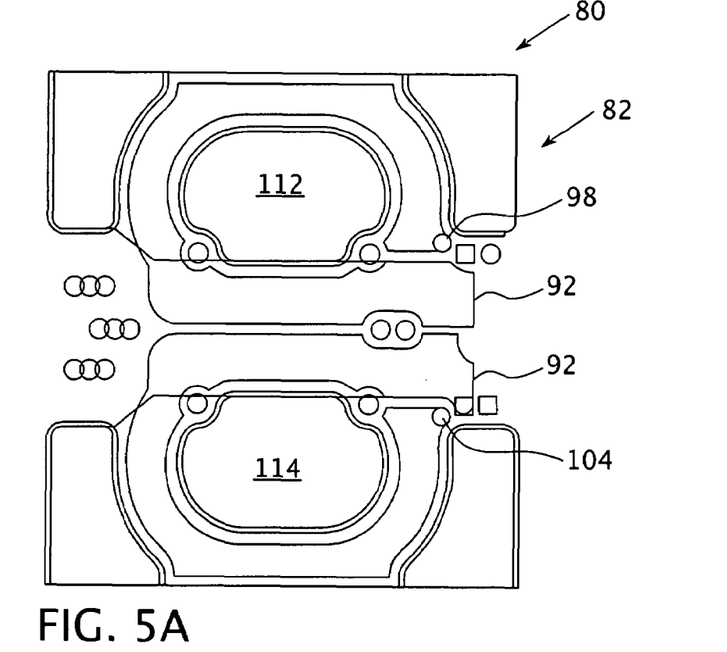
FIGS. 5A-5E illustrate various embodiments of a multi-layer printed circuit board.
Figure 5B:
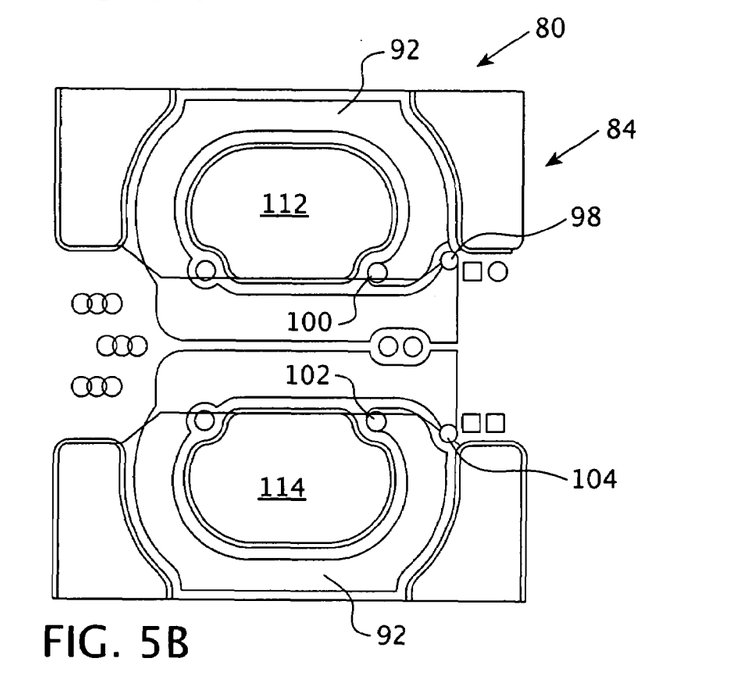
Figure 5C:
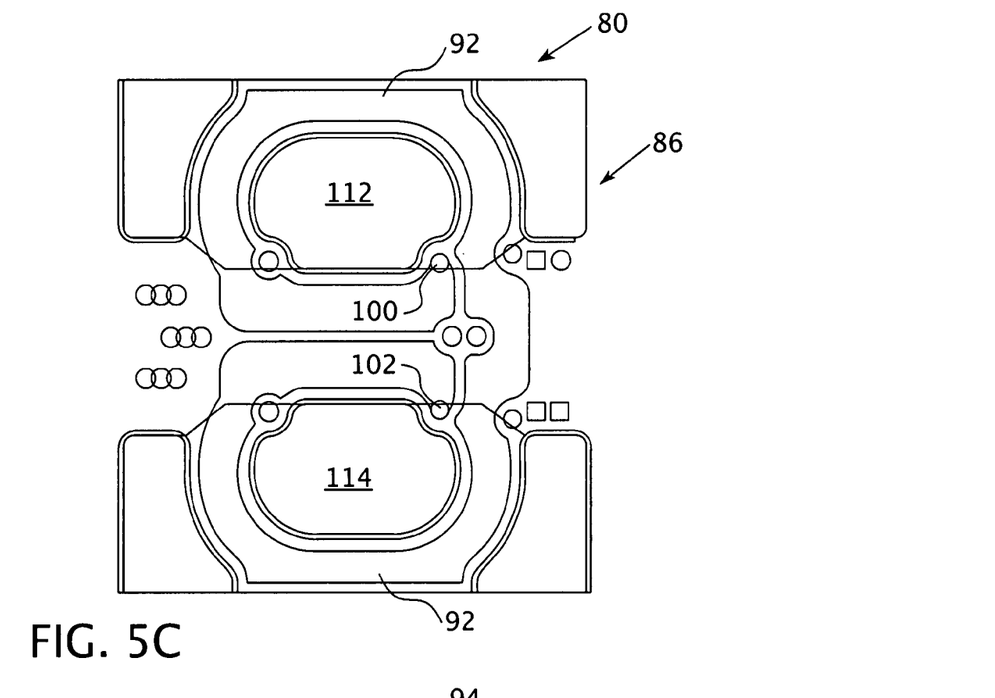

As shown in FIGS. 5A-5C, portions of the first winding 92 may be similar to the first winding 56 of FIGS. 3A-3D. However, due to the arrangement of the first winding 92, one skilled in the art will appreciate that the first and second edges of the first winding 92 define two first footprints similar to the first footprint 62 shown in FIG. 3A and two second footprints similar to the second footprint 66 shown in FIG. 3A.

Figure 5D:
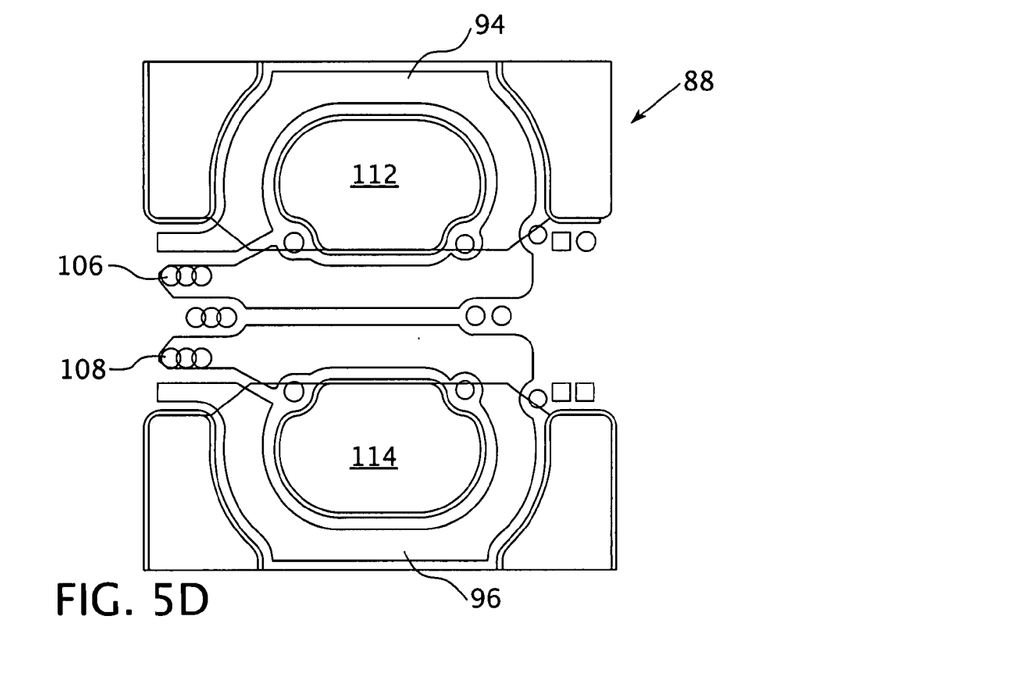

Referring to FIG. 5D, a first turn of the second winding 94 starts at the left edge of the fourth layer 88 of the printed circuit board 80, winds around the first opening 112 in a clockwise direction, and connects to the fifth via 106, which extends from the fourth layer 88 to the fifth layer 90. The fifth via 106 is positioned such that the second footprint is between the fifth via 106 and the first footprint. Similarly, a first turn of the third winding 96 starts at the left edge of the fourth layer 88 of the printed circuit board 80, winds around the second opening 114 in a counter-clockwise direction, and connects to the sixth via 108, which extends from the fourth layer 88 to the fifth layer 90. The sixth via 108 is positioned such that the second footprint is between the sixth via 108 and the first footprint.

Figure 5E:
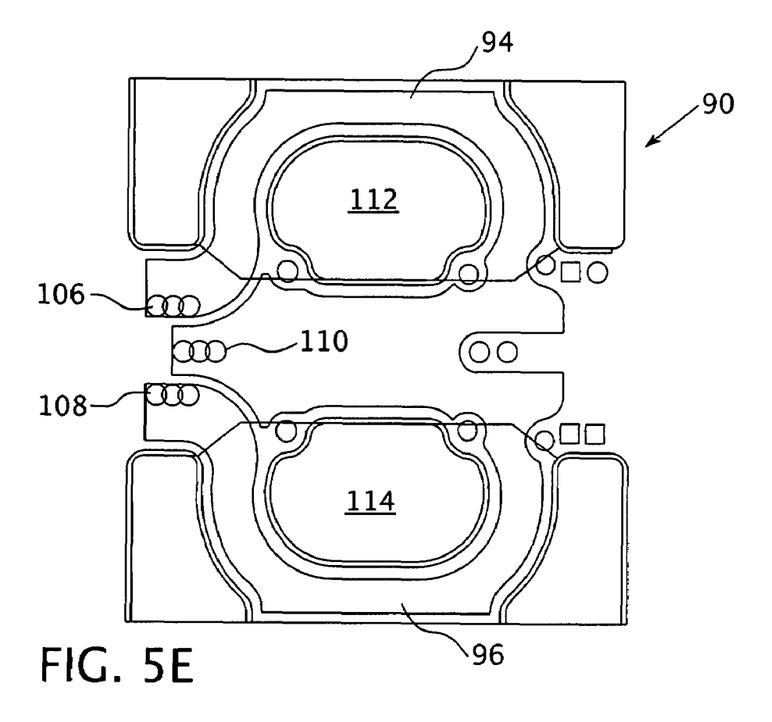
Figure 6A:
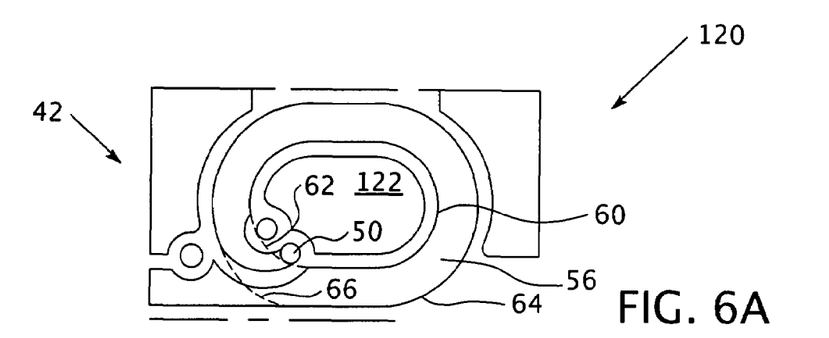
FIGS. 6A-6D illustrate various embodiments of a device that includes the printed circuit board of FIGS. 3A-3D.
Figure 6B:
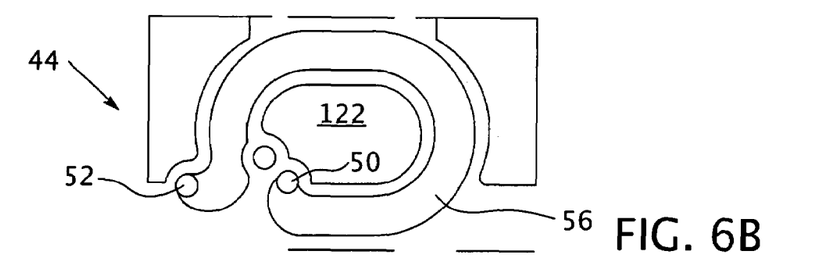
Figure 6C:
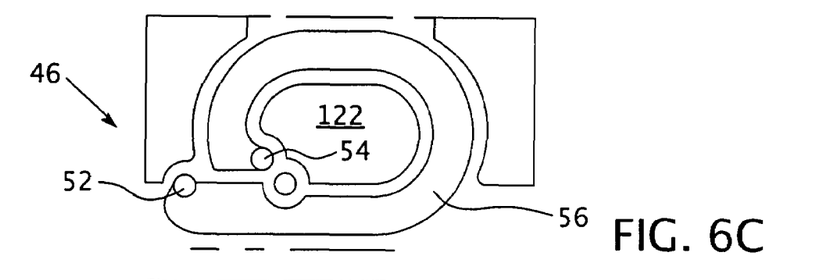
Figure 6D:
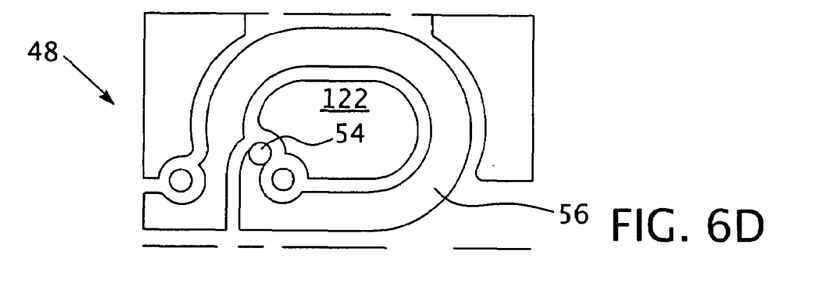
Figure 7A:
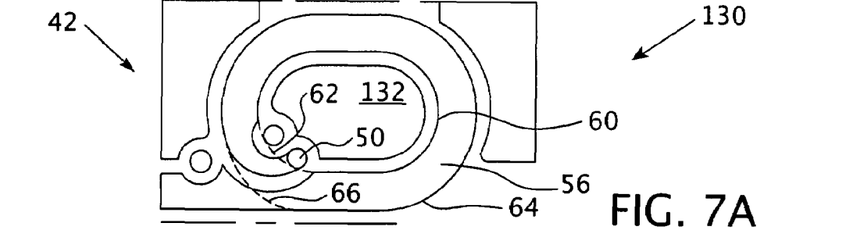
FIGS. 7A-7E illustrate various embodiments of a device that includes the printed circuit board of FIGS. 4A-4E.
Figures 7B, 7C:
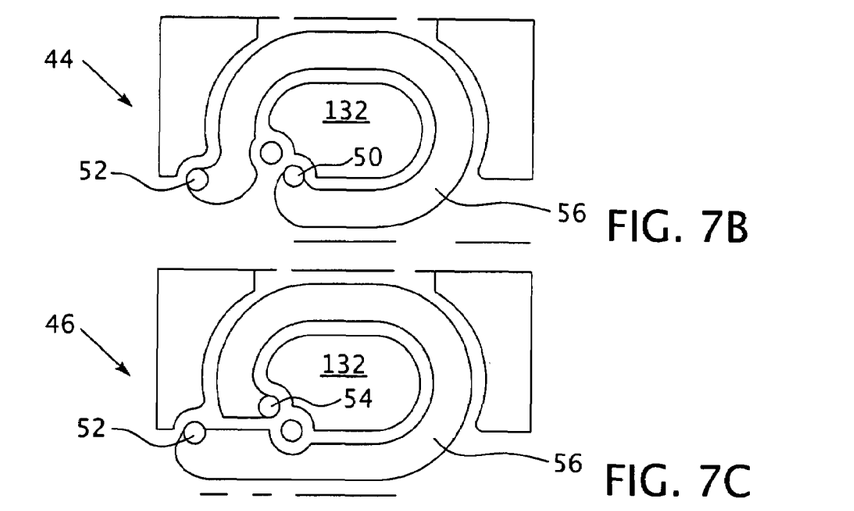
Figure 7D:
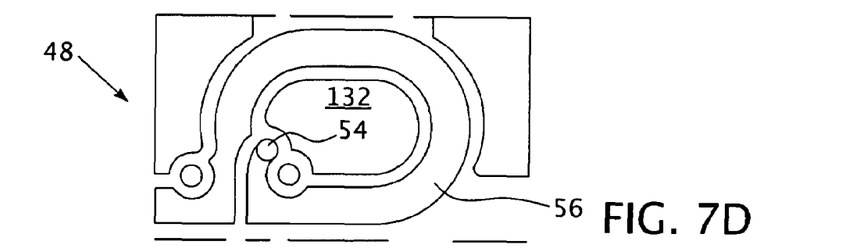
Figure 7E:
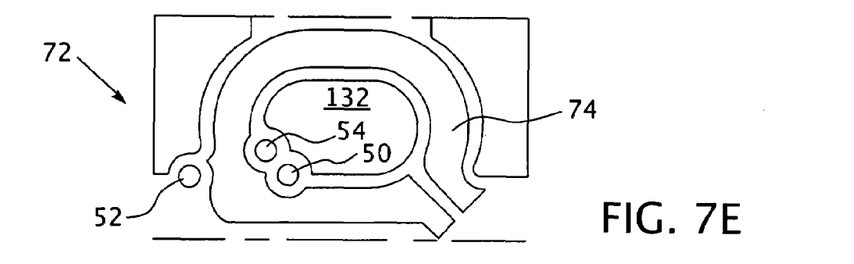
Figure 8A:
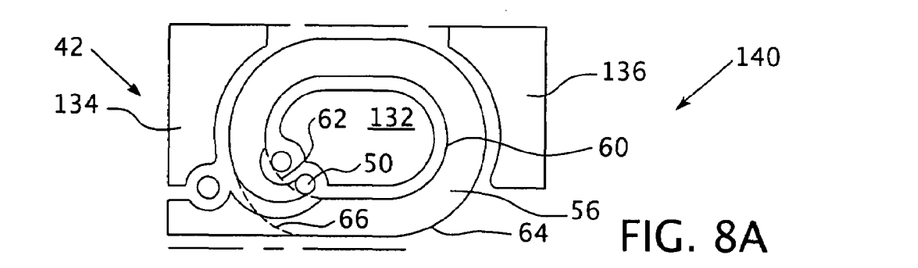
FIGS. 8A-8E illustrate various embodiments of a device that includes the printed circuit board of FIGS. 4A-4E.
Figure 8B:
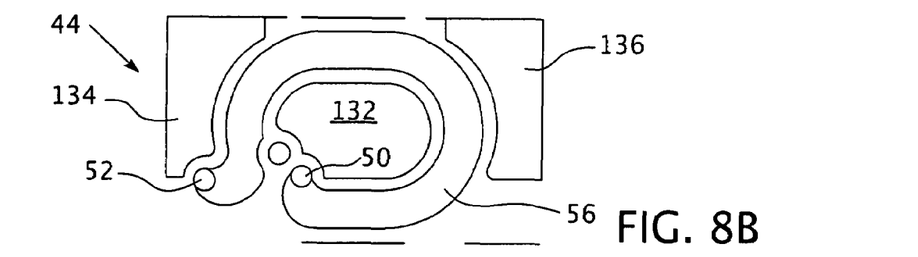
Figure 8C:
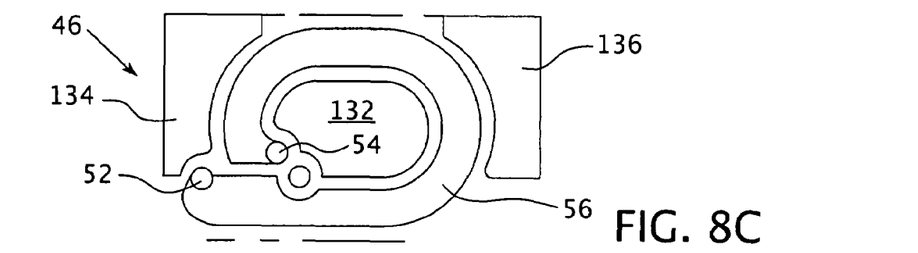
Figure 8D:
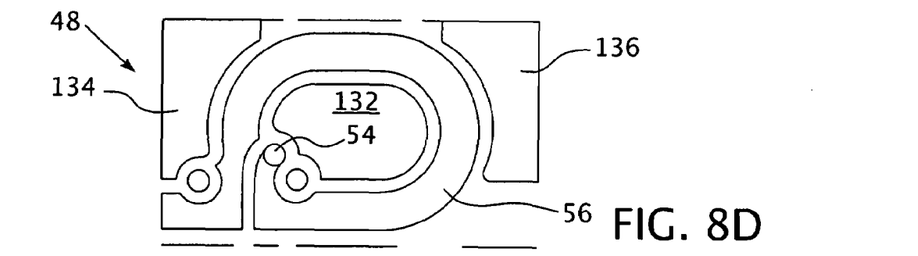
Figure 8E:
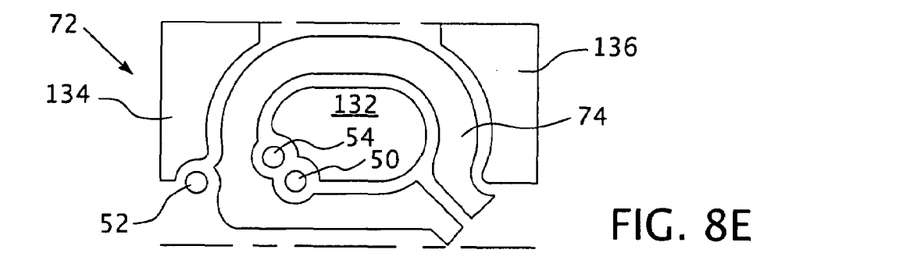

Referring to FIG. 5E, a second turn of the second winding 94 arranged on the fifth layer 90 starts at the fifth via 106, winds around the first opening 112 in a clockwise direction, and connects to the seventh via 110. The seventh via 110 is positioned such that the second footprint is between the seventh via 110 and the first footprint. Similarly, a second turn of the third winding 96 arranged on the fifth layer 90 starts at the sixth via 108, winds around the second opening 114 in a counter-clockwise direction, and connects to the seventh via 110. The seventh via 110 is positioned such that the second footprint is between the seventh via 110 and the first footprint.

FIGS. 6A-6D illustrate various embodiments of a device 120 that includes the printed circuit board 40 of FIGS. 3A-3D. The device 120 may also include a magnetic core 122 positioned in the opening 58. As shown in FIGS. 6A-6D, the magnetic core 122 may be an irregular-shaped magnetic core.

FIGS. 7A-7E illustrate various embodiments of a device 130 that includes the printed circuit board 70 of FIGS. 4A-4E. The device 130 may also include a magnetic core 132 positioned in the opening 58. As shown in FIGS. 7A-7E, the magnetic core 132 may be an irregular-shaped magnetic core. According to various embodiments, the device 130 may be embodied as an inductive structure having one winding, more than one winding, or multiple windings. According to various embodiments, the device 130 may comprise a portion of a converter.

FIGS. 8A-8E illustrate various embodiments of a device 140 that includes the printed circuit board 70 of FIGS. 4A-4E. The device 140 is similar to the device 130 of FIGS. 7A-7E, and the magnetic core 132 may also include a first outer leg 134 proximate the second edge 64 of the first winding 56. The device 140 may also include a second outer leg 136 proximate the second edge 64 of the first winding 56. According to various embodiments, the device 140 may be embodied as a transformer having at least one primary winding and at least one secondary winding. For example, the first winding 56 may be a primary winding, and the second winding 74 may be a secondary winding coupled to the primary winding. According to various embodiments, the device 140 may comprise a portion of a converter.

Figure 9:
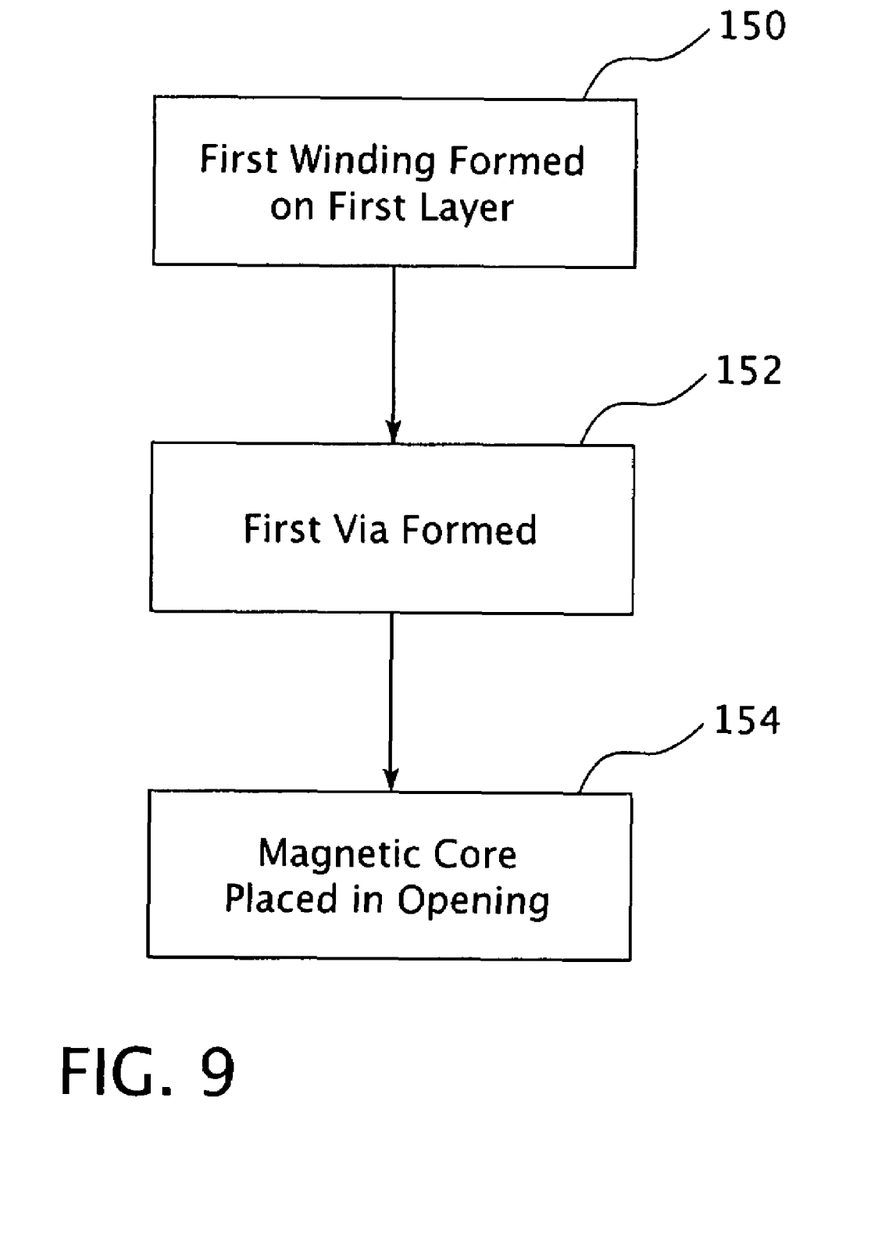
FIG. 9 illustrates various embodiments of a method of forming the device of FIGS. 6A-6D.

FIG. 9 illustrates various embodiments of a method of forming the device 120 of FIGS. 6A-6D. The process begins at block 150, where the first winding 56 is formed on the first layer 42 of the printed circuit board 40. The first winding 56 is formed to include the first edge 60 that defines the first footprint 62 that surrounds and is proximate the opening 58 defined by the printed circuit board 40. The first winding 56 may also be formed to include the second edge 64 that defines the second footprint 66. According to various embodiments, other windings may be formed at block 150. For example, the second winding 74 may be formed on the second layer 44 of the printed circuit board 40 at block 150.

From block 150, the process advances to block 152, where the first via 50 is formed. The first via 50 is formed to connect to the first winding 56, and is formed in a manner such that at least a portion of the first via 50 is between the first footprint 62 and the opening 58. According to various embodiments, other vias may also be formed at block 150. For example, the second and third vias 52, 54 may also be formed at block 150. The second via 52 be may be formed to connect to the first winding 56, and may be formed in a manner such that the second footprint 66 is between the second via 52 and the first footprint 62. The third via 54 may be formed to connect to the first winding 56, and may be formed in a manner such that at least a portion of the third via 54 is between the first footprint 62 and the opening 58.

According to various embodiments, the process may advance from block 152 to block 154, where the magnetic core 122 is placed in the opening 58. According to various embodiments, placing the magnetic core 122 in the opening 58 may also include placing the first and second outer legs 134, 136 proximate the second edge 64 of the first winding 56.

A similar method may be employed to form devices 130, 140. For example, according to various embodiments, a fourth via may be formed such that the fourth via is connected to the second winding 94 and formed in a manner such that the second footprint 66 is between the fourth via and the first footprint 62.

While several embodiments of the invention have been described, it should be apparent, however, that various modifications, alterations and adaptations to those embodiments may occur to persons skilled in the art with the attainment of some or all of the advantages of the invention. For example, the multi-layer printed circuit board 40 may include any number of layers and the first winding 56 may include any number of turns. Similarly, the printed circuit board 70 may include any number of layers and the second winding 74 may include any number of turns. Also, the processes described at blocks 150 and 152 may be carried out in different sequences. This application is therefore intended to cover all such modifications, alterations and adaptations without departing from the scope and spirit of the disclosed invention as defined by the appended claims.

What is claimed is:

1. A multi-layer printed circuit board, comprising:
   at least first and second layers, wherein the layers define an opening therethrough;
   a first winding, wherein the first winding comprises a first winding turn on the first layer and a second winding turn on the second layer, wherein the first winding turn includes an inner edge that defines a first footprint that surrounds and is proximate the opening; and
   a first via connected to the first winding turn on the first layer and the second winding turn on the second layer, wherein at least a portion of the first via is located between the first footprint defined by the inner edge of the first winding turn and the opening.

2. The printed circuit board of claim 1, wherein the first footprint is a regular-shaped footprint.

3. The printed circuit board of claim 1, wherein the opening is an irregular-shaped opening.

4. The printed circuit board of claim 1, wherein the first via is located substantially between the first footprint and the opening.

5. The printed circuit board of claim 1, further comprising a second via connected to the second winding turn on the second layer and a third winding turn on a third layer, wherein the first winding turn further includes an outer edge that defines a second footprint located between the second via and the first footprint.

6. The printed circuit board of claim 5, wherein the second footprint is a regular-shaped footprint.

7. The printed circuit board of claim 5, further comprising a third via connected to the third winding turn on the third layer and a fourth winding turn on a fourth layer, wherein at least a portion of the third via is located between the first footprint and the opening.

8. The printed circuit board of claim 7, wherein the third via is located substantially between the first footprint and the opening.

9. The printed circuit board of claim 1, further comprising a second winding, wherein the second winding comprises a winding turn on a layer of the multi-layer printed circuit board different from the layers of the first winding.

10. The printed circuit board of claim 9, wherein the second winding is arranged on more than one layer of the multi-layer printed circuit board.

11. The printed circuit board of claim 9, wherein the second winding is arranged on a plurality of layers of the multi-layered printed circuit board.

12. The printed circuit board of claim 9, further comprising a second via connected to the winding turn of the second winding, wherein the first winding turn further includes an outer edge that defines a second footprint located between the second via and the first footprint.

13. The printed circuit board of claim 12, further comprising a third via connected to the second winding, wherein the second footprint is between the third via and the first footprint.

14. The printed circuit board of claim 13, further comprising:
   a fourth via connected to the first winding, wherein at least a portion of the fourth via is positioned between the first footprint and the opening; and
   a fifth via connected to the first winding, wherein the second footprint is between the fifth via and the first footprint.

15. The printed circuit board of claim 9, further comprising a third winding arranged on a third layer of the multi-layer printed circuit board.

16. A device, comprising:
   a multi-layer printed circuit board, wherein the printed circuit board includes:
      at least first and second layers, wherein the layers define an opening therethrough;
      a first winding, wherein the first winding comprises a first winding turn on the first layer and a second winding turn on the second layer, wherein the first winding turn includes an inner edge that defines a first footprint that surrounds and is proximate the opening; and
      a first via connected to the first winding turn on the first layer and the second winding turn on the second layer, wherein at least a portion of the first via is located between the first footprint defined by the inner edge of the first winding turn and the opening; and
   a magnetic core in the opening.

17. The device of claim 16, wherein the magnetic core is an irregular-shaped magnetic core.

18. The device of claim 16, further comprising:
   a second via connected to the second winding turn on the second layer and a third winding turn on a third layer, wherein the first winding turn further includes an outer edge that defines a second footprint located between the second via and the first footprint; and
   a third via connected to the third winding turn on the third layer and a fourth winding turn on a fourth layer, wherein at least a portion of the third via is located between the first footprint and the opening.

19. The device of claim 18, further comprising a second winding coupled to the first winding.

20. The device of claim 19, further comprising a fourth via connected to the second winding, wherein the second footprint is between the fourth via and the first footprint.

21. The device of claim 16, wherein the device is an inductive structure having multiple windings.

22. The device of claim 16, wherein the device is a transformer.

23. The device of claim 16, wherein the device comprises a portion of a converter.

24. A method of forming a device, the method comprising:
- forming at least first and second layers of a printed circuit board, wherein forming the layers includes defining an opening therethrough;
- forming a first winding, wherein forming the first winding includes forming a first winding turn on the first layer and a second winding turn on the second layer, and wherein forming the first winding turn includes forming the first winding turn to include an inner edge that defines a first footprint that surrounds and is proximate the opening; and
- forming a first via connected to the first winding turn on the first layer and the second winding turn on the second layer, wherein forming the first via includes forming the first via such that at least a portion of the first via is located between the first footprint defined by the inner edge of the first winding turn and the opening.

25. The method of claim 24, further comprising placing a magnetic core in the opening.

26. The method of claim 24, further comprising:
- forming the first winding turn to include an outer edge that defines a second footprint;
- forming a second via connected to the second winding turn on the second layer and a third winding turn on a third layer, wherein forming the second via includes forming the second via such that the second footprint is located between the second via and the first footprint; and
- forming a third via connected to the third winding turn on the third layer and a fourth winding turn on a fourth layer, wherein forming the third via includes forming the third via such that at least a portion of the third via is located between the first footprint and the opening.

27. The method of claim 24, further comprising placing a magnetic core in the opening.

28. The method of claim 24, further comprising forming a second winding; wherein forming the second winding includes forming a winding turn on a layer of the printed circuit board different from the layers of the first winding.

29. The method of claim 28, further comprising:
- forming the first winding turn to include an outer edge that defines a second footprint; and
- forming a second via connected to the winding turn of the second winding, wherein forming the second via includes forming the second via such that the second footprint is located between the second via and the first footprint.

* * * * *